United States Patent
Tandy

(10) Patent No.: US 6,542,720 B1
(45) Date of Patent: *Apr. 1, 2003

(54) MICROELECTRONIC DEVICES, METHODS OF OPERATING MICROELECTRONIC DEVICES, AND METHODS OF PROVIDING MICROELECTRONIC DEVICES

(75) Inventor: Patrick W. Tandy, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,997

(22) Filed: Mar. 1, 1999

(51) Int. Cl.[7] .................................................. H04B 1/40
(52) U.S. Cl. ........................... 455/90; 455/66; 455/79; 455/351; 455/575; 257/725; 327/564
(58) Field of Search ......................... 455/73, 80, 84, 455/66, 575, 77, 550, 556, 90, 87, 41, 74, 300, 333, 83; 257/723, 924, 724, 787, 679, 700, 702, 725, 728, 778; 340/825.32, 825.54; 342/42, 44, 51

(56) References Cited

U.S. PATENT DOCUMENTS

| | | | |
|---|---|---|---|
| 3,651,434 A | 3/1972 | McGeough et al. ...... 333/84 M |
| 3,936,864 A | 2/1976 | Benjamin ...................... 357/74 |
| 5,117,068 A | 5/1992 | Seieroe et al. ............. 174/52.4 |
| 5,313,211 A * | 5/1994 | Tokuda et al. ................. 342/50 |
| 5,337,063 A * | 8/1994 | Takahira ...................... 343/741 |
| 5,340,968 A * | 8/1994 | Watanabe et al. ........... 235/375 |
| 5,347,263 A * | 9/1994 | Carroll et al. |
| 5,497,140 A * | 3/1996 | Tuttle ........................... 342/51 |
| 5,563,086 A * | 10/1996 | Bertin et al. .................. 437/52 |
| 5,621,913 A * | 4/1997 | Tuttle et al. .................. 455/90 |
| 5,692,298 A | 12/1997 | Goetz et al. ................... 29/848 |
| 5,734,198 A | 3/1998 | Stave .......................... 257/666 |
| 5,736,783 A | 4/1998 | Wein et al. .................. 257/691 |
| 5,754,948 A * | 5/1998 | Metze ........................... 455/66 |
| 5,757,074 A * | 5/1998 | Matloubian et al. ........ 257/702 |
| 5,763,945 A | 6/1998 | Corisis et al. .............. 257/692 |
| 5,818,105 A | 10/1998 | Kouda .......................... 257/696 |
| 5,842,118 A * | 11/1998 | Wood, Jr. ..................... 342/51 |
| 5,903,050 A * | 5/1999 | Thuraiajaratnam et al. . 257/666 |
| 5,903,168 A * | 5/1999 | Yang et al. ..................... 326/86 |
| 6,013,949 A * | 1/2000 | Tuttle .......................... 257/723 |
| 6,023,610 A * | 2/2000 | Wood, Jr. ..................... 455/101 |
| 6,060,342 A * | 5/2000 | Montauti et al. ........... 438/125 |
| 6,078,791 A * | 6/2000 | Tuttle et al. .................. 455/90 |
| 6,140,697 A * | 10/2000 | Usami et al. ................ 257/679 |
| 6,168,084 B1 * | 1/2001 | Mish .......................... 235/492 |
| 6,169,295 B1 * | 1/2001 | Koo ............................. 257/81 |
| 6,170,748 B1 * | 1/2001 | Hash et al. .................. 235/385 |
| 6,172,425 B1 * | 1/2001 | Steijer et al. ............... 257/787 |
| 6,175,124 B1 * | 1/2001 | Cole et al. ..................... 257/48 |
| 6,180,433 B1 * | 1/2001 | Furey et al. ................. 438/106 |
| 6,184,060 B1 * | 2/2001 | Siniaguine .................. 438/106 |
| 6,263,193 B1 * | 7/2001 | Iseki et al. ..................... 455/84 |
| 6,335,669 B1 * | 1/2002 | Miyazaki et al. .......... 174/52.3 |

FOREIGN PATENT DOCUMENTS

JP 200223656 * 8/2000 ........... H01L/25/65

* cited by examiner

Primary Examiner—Thanh Cong Le
Assistant Examiner—Pablo N Tran
(74) Attorney, Agent, or Firm—Wells St. John P.S.

(57) ABSTRACT

Microelectronic devices, methods of operating microelectronic devices, and methods of providing microelectronic devices are described. In one embodiment, a microelectronic device includes a microelectronic package which provides a housing within which integrated circuitry is received. An integrated circuit die is received within the microelectronic package and includes integrated circuitry formed thereon. The integrated circuitry comprises first transmit/receive circuitry configured to transmit and receive radio frequency signals.

31 Claims, 3 Drawing Sheets

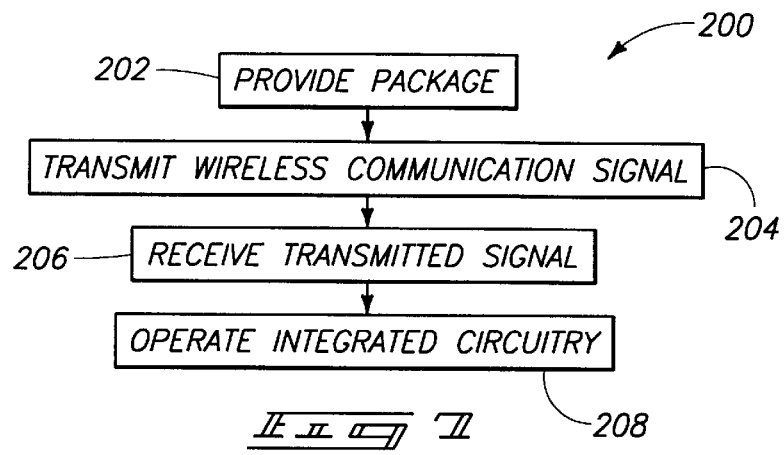
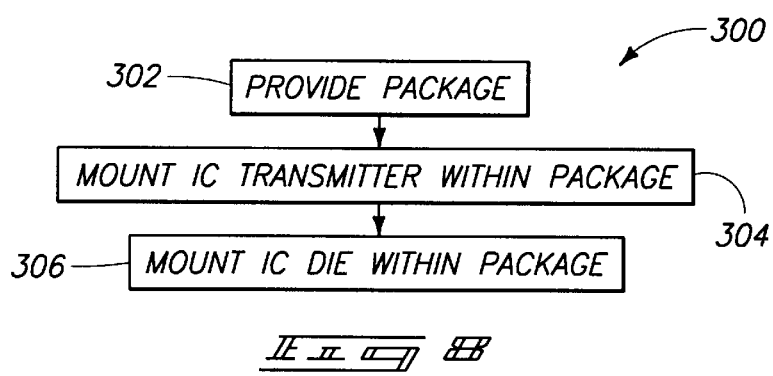
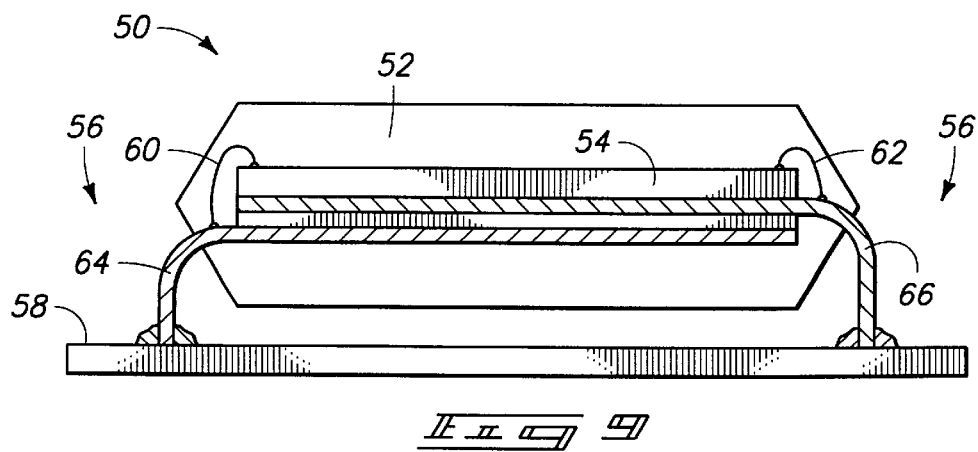

MICROELECTRONIC DEVICES, METHODS OF OPERATING MICROELECTRONIC DEVICES, AND METHODS OF PROVIDING MICROELECTRONIC DEVICES

TECHNICAL FIELD

This invention pertains to microelectronic devices, to methods of operating microelectronic devices, and to methods of forming microelectronic devices.

BACKGROUND OF THE INVENTION

As semiconductor integrated circuit (IC) devices continue to shrink in dimension, challenges are posed with respect to packaging the integrated circuitry into microelectronic devices. In some prior art integrated circuitry device, individual IC chips (die) are connected to inner leads of a lead frame by wire bonds. The chip, wire bonds, and inner leads are completely encapsulated for protection with a substance such as plastic or ceramic. Outer leads communicate with the inner leads of the lead frame, but the outer leads typically remain exposed for mounting of the packaged device to external circuitry, such as a printed circuit board. Exemplary constructions are disclosed in U.S. Pat. Nos. 5,734,198, 5,736,783, 5,763,945, 5,818,105 5,117,068, and 5,692,298, the disclosures of which are incorporated by reference herein.

In a conventional construction, a semiconductor die is placed on and bonded to a center die paddle of a lead frame for support. Inner lead fingers of the lead frame are disposed proximate the paddle but do not contact or communicate with the paddle. Rather, wire bonds communicate between contact pads (terminals) on the die and the inner lead fingers of the lead frame by spanning a gap between the die and the fingers. The wire bonds allow for the transmission of electrical signals between the die and the lead frame. The lead fingers allow the chip or die to be electrically connected with other chips or die for providing an operable microelectronic device.

Wire bonds can be problematic for a number of different reasons. First, additional processing steps are needed to ensure that the wire bonds are adequately formed between the lead frame and bond pads on the integrated circuit die. Such processing requires precise placement of the wire bonds or the operation of the integrated circuit die can be compromised. Additionally, because wire bonds are typically very thin electrical connections they can become disconnected and cause operational failure of the finished device.

Accordingly, this invention arose out of concerns associated with providing improved microelectronic devices and methods of forming the same which reduce processing complexities and provide for improved performance.

SUMMARY OF THE INVENTION

Microelectronic devices, methods of operating microelectronic devices, and methods of forming microelectronic devices are described. In one embodiment, a microelectronic device includes a microelectronic package which provides a housing within which integrated circuitry is received. An integrated circuit die is received within the microelectronic package and includes integrated circuitry formed thereon. The integrated circuitry comprises first transmit/receive circuitry configured to transmit and receive radio frequency signals. Second transmit/receive circuitry is provided, discrete from the first transmit/receive circuitry, and is contained within the microelectronic package. The second circuitry is configured to transmit and receive radio frequency signals, wherein the first and second transmit/receive circuitry are configured to establish wireless communication between one another within the microelectronic package. In another embodiment, a microelectronic package is provided having housed therein integrated circuitry. Wireless communication is produced using a transmitter inside the microelectronic package. The produced wireless communication is received using a receiver inside the microelectronic package. Responsive to the receiving of such communication, the integrated circuitry is caused to operate in a designed manner.

BRIEF DESCRIPTION OF THE DRAWINGS

Preferred embodiments of the invention are described below with reference to the following accompanying drawings.

FIG. 7 is a flow diagram which describes one embodiment of the present invention.

FIG. 8 is a flow diagram which describes one embodiment of the present invention.

FIG. 9 is a side elevational view of a microelectronic device in accordance with one embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
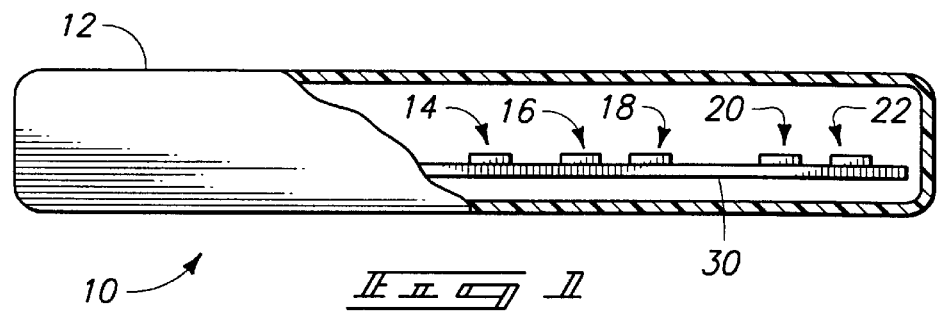
FIG. 1 is a side elevational view of a microelectronic device in accordance with one embodiment of the invention, with a portion having been broken away for clarity.

Referring to FIGS. 1–5, and particularly to FIG. 1, an exemplary microelectronic device in accordance with one embodiment of the invention is shown generally at 10. The term "microelectronic device" as used in this document will be understood to include, without limitation, integrated circuit devices which are resident on a single die or chip, or a collection of die or chips arranged into an operable integrated circuit configuration. Device 10 includes a microelectronic package 12 which provides a housing within which integrated circuitry is received. The term "microelectronic package" will be understood to mean a housing or container within which integrated circuitry is received to provide a microelectronic device. By way of example only, example microelectronic packages include product containers such as computer hard drive housings, cellular phone housings, and other hand-held electronic device housings. Such microelectronic packages need not, however, be hand-held. In addition, microelectronic packages can include self-contained hermetically-sealed packages such as those which conventionally contain integrated circuit die. Such packages can be formed from plastic, ceramic, or any other suitable material.

In FIG. 1, a portion of package 12 has been broken away for clarity. An integrated circuit die 14 is received within microelectronic package 12 and has integrated circuitry formed thereon. In this example, package 12 includes individual die 16, 18, 20, and 22 which have been prepackaged into individual respective integrated circuit chips which contain integrated circuitry which can be or is electrically connected into an operative arrangement.

Figure 2:
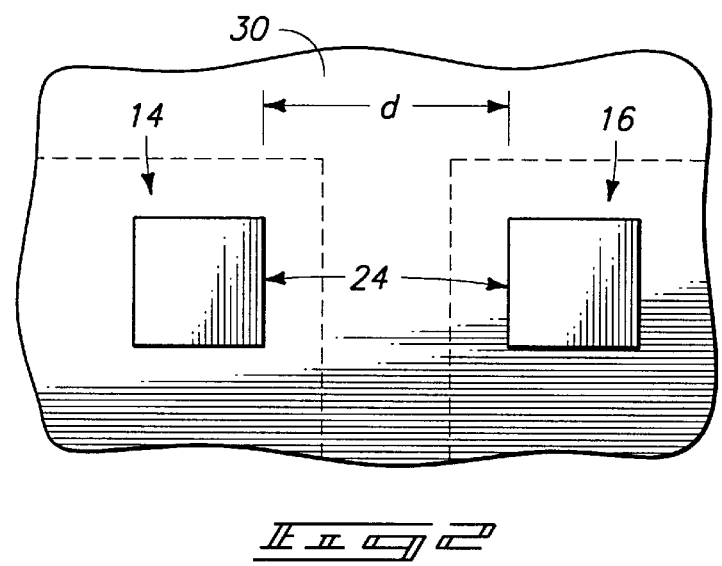
FIG. 2 is a top plan view of a portion of a microelectronic device in accordance with one embodiment of the invention.

In FIG. 2, a top plan view of die 14, 16 is shown. The dashed lines which bound the individual die are intended to represent the exterior of a die or chip container. In a preferred embodiment, one of the integrated circuit die, e.g. die 14, includes integrated circuitry 24 (FIG. 4) having first transmit/receive circuitry 26 configured to transmit and receive radio frequency signals. Second transmit/receive circuitry (such as circuitry 26) is provided which is preferably discrete from first transmit/receive circuitry 26. Such second transmit/receive circuitry can be received or supported by die 16. Accordingly, the second transmit/receive circuitry is contained within microelectronic package 12 and is configured to transmit and receive radio frequency signals.

In a preferred embodiment, the first and second transmit/receive circuitry 26 are configured to establish wireless communication between one another within the microelectronic package. In one embodiment, second transmit/receive circuitry (such as circuitry 26b in FIG. 5) is disposed on a second integrated circuit die such as die 14b. In another embodiment, the microelectronic device further includes a substrate 30 (FIGS. 1 and 2) disposed within the housing and supporting the first and second transmit/receive circuitry 26. Any suitable material can be used for substrate 30 with exemplary substrates including a printed circuit board.

In one embodiment, microelectronic devices can be provided which are small in size, such as those which can be hand-carried or transported. In another embodiment, the integrated circuitry comprising the first and second transmit/receive circuitry 26 are disposed within 24 inches of one another (distance d in FIG. 2) within the microelectronic package. In another embodiment (FIGS. 3–5), integrated circuitry 24 comprising the first and second transmit/receive circuitry 26 respectively, comprise individual respective antennas 32 (FIG. 5) which are configured to transmit and receive wireless communication. The antennas can be connected to their respective integrated circuitry 24 by a conductive trace of material (indicated as a dashed line extending between integrated circuitry 24 and antenna 32 in FIG. 3) over the die. Further augmentation can be provided by connecting the antenna to a lead finger, similar to lead fingers 34, 36 (FIG. 3) via a wire bond. In a preferred embodiment, the antennas are configured to transmit and receive wireless RF communication.

In one embodiment, antennas 32 (FIG. 5) are disposed within 24 inches of one another within the microelectronic package. In another embodiment, the antennas are disposed within one inch of one another within the microelectronic package. In yet another embodiment, the antennas are disposed within one-half inch of one another within the microelectronic package.

Figure 3:
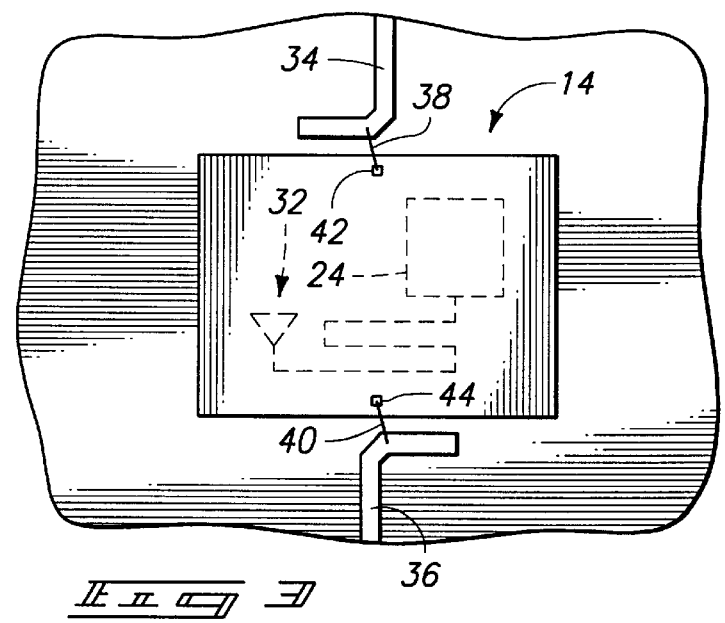
FIG. 3 is a top plan view of a portion of a microelectronic device in accordance with one embodiment of the invention.

In one embodiment, and one perhaps best shown in FIG. 3, die 14 is void of external electrical connections for anything other than at least one of power and ground. In the illustrated example, lead fingers 34, 36 are provided and are coupled electrically with die 14 via wire bonds 38, 40 respectively. The wire bonds connect with contact pads 42, 44 respectively on die 14 and provide the connections through which power and ground are established. These connections, in this example, constitute the only connections which are necessarily made through lead fingers to the outside world. Of course, other connections can be made through lead fingers which are not specifically illustrated.

Figure 4:
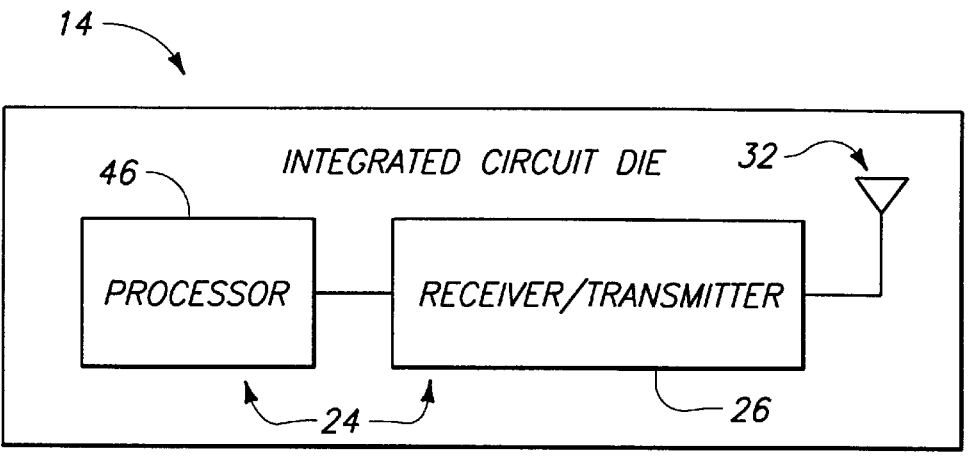
FIG. 4 is a high level block diagram of an integrated circuit die in accordance with one embodiment of the invention.
Figure 5:
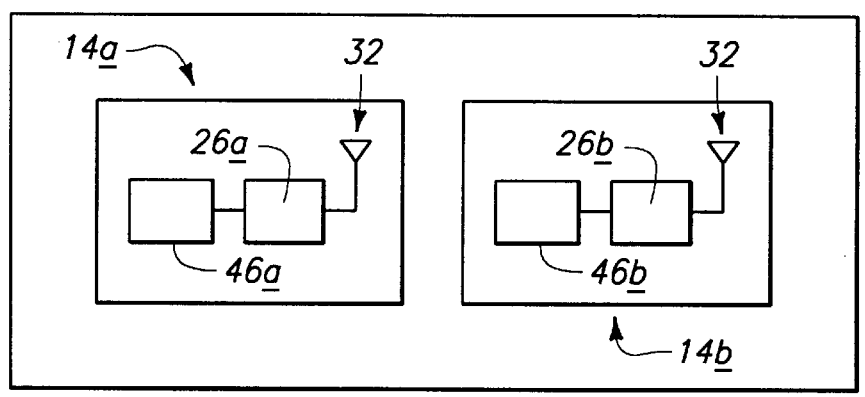
FIG. 5 is a high level block diagram of a microelectronic device in accordance with one embodiment of the invention.

Referring still to FIGS. 1–5, and in accordance with another embodiment, an integrated circuit die 14 is received within microelectronic package 12 and has integrated circuitry 24 thereon which is configured to operate in a designed manner. By "designed manner" is meant any manner in which integrated circuitry is conventionally able to operate. In this example, integrated circuitry 24 includes a processor 46 (FIG. 4), 46a, 46b (FIG. 5). Processor 46 can comprise any suitably formed or provided processor, e.g. a microprocessor, which is conventionally employed in integrated circuitry devices. FIG. 4 also shows integrated circuitry 24 as including a receiver/transmitter 26. Although this element is shown as a combination receiver/transmitter, it can comprise only a receiver or only a transmitter.

FIG. 5 shows an exemplary device which comprises two die 14a, 14b. These die are preferably part of and received inside of microelectronic package 12. An integrated circuitry transmitter 26a is provided and received within microelectronic package 12. The transmitter can, but need not have a companion receiver. The transmitter is preferably configured to transmit wireless communication. An integrated circuitry receiver 26b is provided and is received within microelectronic package 12. The receiver can, but need not have a companion transmitter. Receiver 26b is preferably configured to receive wireless communication which is transmitted by integrated circuitry transmitter 26a. In a preferred embodiment, receiver 26b is operably coupled with a processor 46b and configured to provide data to the processor responsive to received wireless communication. In one embodiment, receiver 26b comprises a portion of the integrated circuitry which is formed on die 14b. In another embodiment, integrated circuitry transmitter 26a is disposed on a second integrated circuit die. In another embodiment, more than one die is received within the housing, as shown best in FIG. 1. The plurality of die all may or may not be configured to communicate with one another.

Preferably, die 14a, 14b are configured in some applications to establish wireless communication between them in a manner which serves to eliminate most, if not all physical-electrical connections which were formerly employed to establish wireless communication therebetween. For example, and as prevalent in the prior art, individual die were connected, via suitable wire bonds, to lead frames which, in turn, established electrical communication with the outside world. In accordance with some of the inventive structures and methods, many of the wire bonds and lead fingers on the lead frames can be eliminated because now, functional communication between the separate die takes place through the transmission of wireless communication. Of course, in some embodiments, physical-electrical connection can be provided in order to supply desired die with suitable power and ground connections.

In one embodiment, the transmitter and the receiver are disposed within the microelectronic package within 24 inches of one another. In another embodiment, the transmitter and the receiver are disposed within the microelectronic package within one inch of one another. In another embodiment, the transmitter and receiver are disposed within the microelectronic package within one-half inch of one another.

Preferably, processor 46 is configured to receive data which is provided by receiver 26 and, responsive thereto, cause the integrated circuitry on die 14 to operate in the above-mentioned designed manner. In a preferred embodiment, the microelectronic device 10 is hand-transportable.

Referring still to FIGS. 1–5, and in accordance with another embodiment of the invention, a microelectronic device includes a microelectronic package 12 which provides a housing within which integrated circuitry is received. The microelectronic package preferably includes an integrated circuitry-supporting substrate 30 inside the housing. An integrated circuit die, e.g. any and/or all of die 14–22, is received within package 12 and supported by substrate 30. The die preferably has integrated circuitry formed thereon comprising first transmit/receive circuitry 26a (FIG. 5) configured to transmit and receive wireless communication. Second transmit/receive circuitry 26b is provided and is preferably discrete from first transmit/receive circuitry 26a. The second transmit/receive circuitry 26b is preferably contained within microelectronic package 12 and is configured to transmit and receive wireless communication. In this example, the first and second transmit/receive circuitry 26a, 26b are configured to establish wireless communication between one another within the microelectronic package 12 sufficient to enable the integrated circuitry on die 14 to operate in a designed manner. In one embodiment, the second transmit/receive circuitry is supported by the integrated circuit-supporting substrate 30. In another embodiment, the second transmit/receive circuitry 26b is disposed on a second integrated circuit die supported by the integrated circuitry-supporting substrate 30. In another embodiment, device 10 is hand-transportable.

In another embodiment, individual antennas 32 (FIG. 5) are provided and are operably associated with the first and second transmit/receive circuitry 26a, 26b respectively. In one embodiment, the antennas are disposed within 24 inches of one another. In another embodiment, the antennas are disposed within one inch of one another. In yet another embodiment, the antennas are disposed within one-half inch of one another.

Figure 6:
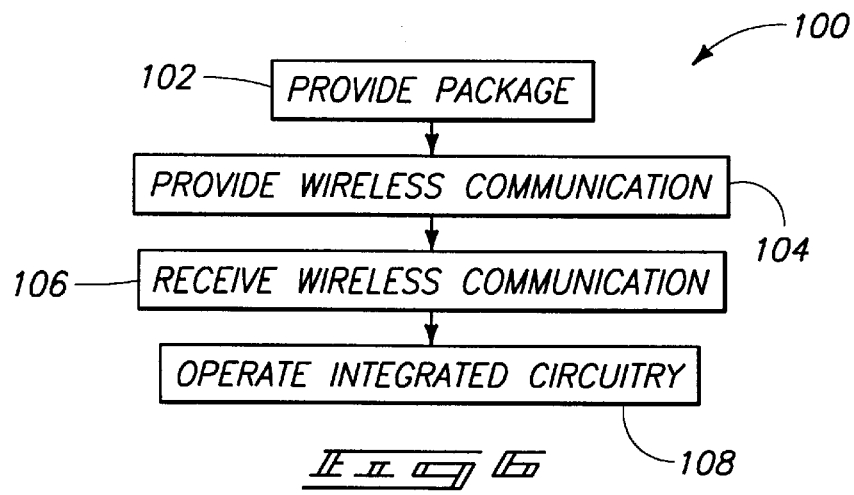
FIG. 6 is a flow diagram which describes one embodiment of the present invention.

Referring to FIG. 6, and in accordance with another embodiment of the invention, a method of operating a microelectronic device is shown generally at 100 and includes at 102, providing a microelectronic package having housed therein integrated circuitry. At 104, wireless communication is produced using a transmitter inside of the microelectronic package. At 106, the produced wireless communication is received using a receiver inside the microelectronic package. At 108, and responsive to the receiving of the wireless communication, the integrated circuitry within the microelectronic package is caused to operate in a designed manner. In one embodiment, the production of wireless communication at 104 takes place through the use of an integrated circuitry transmitter. In another embodiment, the receipt of such wireless communication takes place through the use of an integrated circuitry receiver. Other embodiments further comprise positioning the transmitter and the receiver inside the microelectronic package within 24 inches, one inch, and one-half inch respectively, of one another. In yet another embodiment, provision of the integrated circuitry within the microelectronic package comprises fabricating the circuitry.

Referring to FIG. 7, and in accordance with another embodiment of the invention, a method of operating a microelectronic device is shown generally at 200 and includes, at 202, providing a microelectronic package having housed therein integrated circuitry. At 204, a wireless communication signal is transmitted using an integrated circuitry transmitter inside the microelectronic package. At 206, the transmitted wireless communication signal is received using an integrated circuitry receiver inside the microelectronic package. At 208, and responsive to receiving the wireless communication signal, the integrated circuitry within the microelectronic package is caused to operate in a designed manner. In one embodiment, the transmitter and the receiver are positioned within 24 inches of one another. In other embodiments, the transmitter and the receiver are positioned within one inch and one-half inch respectively, of one another. Further aspects of the invention include fabricating one of the integrated circuitry transmitter or receiver, or preferably both.

Referring to FIG. 8, and in accordance with another embodiment of the invention, a method of providing a microelectronic device is shown generally at 300 and includes at 302 providing a microelectronic package within which integrated circuitry is to be housed. At 304, an integrated circuitry transmitter is mounted within the package. At 306, an integrated circuit die is mounted within the package and includes integrated circuitry disposed thereon. The integrated circuitry preferably includes an integrated circuit receiver, wherein the transmitter and the receiver are configured to establish direct wireless communication with one another. Preferably, the wireless communication permits operating instructions for the integrated circuitry on the die to be transmitted and received within the microelectronic package. In one embodiment, the transmitter and the receiver are mounted within 24 inches of one another. In another embodiment the transmitter and the receiver are mounted within one inch of one another. In yet another embodiment, the transmitter and the receiver are mounted within one-half inch of one another.

Referring to FIG. 9, an exemplary microelectronic device is shown generally at 50 and includes a microelectronic package 52. Package 52 contains and supports an integrated circuit die 54. Physical-electrical connection structure is provided and shown generally at 56, and secures die 54 to an integrated circuitry-supporting substrate 58. The physical-electrical connection structure provides both electrical and physical connections between circuit die 54 and outside world circuitry. In this embodiment, physical-electrical connection structure 56 supplies electrical connections only for power and ground. In this specific example, the physical-electrical connection structure includes respective wire bonds 60, 62 which are individually and respectively connected with lead fingers 64, 66.

Advantages of various embodiments of the invention include a reduction in the number wire bonds necessary to impart functionality to a microelectronic device. Relatedly, the number of processing steps which are needed to ensure that wire bonds are adequately formed between a lead frame and bond pads on an integrated circuit die can be reduced. Hence, risks which were formerly associated with wire bonds becoming detached because of the very thin nature of such connections can be reduced. Various embodiments of the invention can provide improved microelectronic devices and methods of forming the same which reduce processing complexities and provide for improved performance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A microelectronic device comprising:
   a microelectronic package providing a housing within which integrated circuitry is received;
   an integrated circuit die received within the microelectronic package and having integrated circuitry formed thereon, the integrated circuitry comprising first transmit/receive circuitry configured to transmit and receive radio frequency signals; and
   second transmit/receive circuitry, discrete from the first transmit/receive circuitry and contained within the microelectronic package, the second transmit/receive circuitry being configured to transmit and receive radio frequency signals, wherein the first and second transmit/receive circuitry are configured to establish wireless communication between one another within the microelectronic package, wherein the die is void of external electrical connections for anything other than at least one of power and ground.

2. The microelectronic device of claim 1, wherein the microelectronic package contains more than one die.

3. The microelectronic device of claim 1, wherein the second transmit/receive circuitry is disposed on a second integrated circuit die.

4. The microelectronic device of claim 1, further comprising a substrate disposed within the housing, and wherein the first and second transmit/receive circuitry are supported on the substrate.

5. The microelectronic device of claim 1, further comprising a printed circuit board substrate disposed within the housing, and wherein the first and second transmit/receive circuitry are supported on the printed circuit board substrate.

6. The microelectronic device of claim 1, wherein the microelectronic device is hand-carriable.

7. The microelectronic device of claim 1, wherein the first and second transmit/receive circuitry are disposed within 24 inches of one another within the microelectronic package.

8. The microelectronic device of claim 1, wherein the first and second transmit/receive circuitry comprise individual respective antennas configured to transmit and receive wireless communication.

9. The microelectronic device of claim 1, wherein the first and second transmit/receive circuitry comprise individual respective antennas configured to transmit and receive wireless RF communication.

10. The microelectronic device of claim 1, wherein the first and second transmit/receive circuitry comprise individual respective antennas configured to transmit and receive wireless communication, the antennas being disposed within 24 inches of one another within the microelectronic package.

11. The microelectronic device of claim 1, wherein the first and second transmit/receive circuitry comprise individual respective antennas configured to transmit and receive wireless communication, the antennas being disposed within one inch of one another within the microelectronic package.

12. The microelectronic device of claim 1, wherein the first and second transmit/receive circuitry comprise individual respective antennas configured to transmit and receive wireless communication, the antennas being disposed within one half inch of one another within the microelectronic package.

13. A microelectronic device comprising:
   a microelectronic package providing a housing within which integrated circuitry is received, and an integrated circuitry-supporting substrate inside the housing;
   an integrated circuit die received within the microelectronic package and supported by the integrated circuitry-supporting substrate, the integrated circuit die having integrated circuitry formed thereon, the integrated circuitry comprising first transmit/receive circuitry configured to transmit and receive wireless communication; and
   second transmit/receive circuitry, discrete from the first transmit/receive circuitry and contained within the microelectronic package, the second transmit/receive circuitry being configured to transmit and receive wireless communication, wherein the first and second transmit/receive circuitry are configured to establish wireless communication between one another within the microelectronic package sufficient to enable the integrated circuitry on the integrated circuitry die to operate in a designed manner, wherein the integrated circuit die has physical-electrical connection structure securing it to the integrated circuitry-supporting substrate, said structure supplying electrical connections only for power and ground.

14. The microelectronic device of claim 13, wherein the second transmit/receive circuitry is disposed on a second integrated circuit die supported by the integrated circuitry-supporting substrate.

15. The microelectronic device of claim 13, wherein the second transmit/receive circuitry is supported by the integrated circuitry-supporting substrate.

16. The microelectronic device of claim 13, wherein the device is hand-transportable.

17. The microelectronic device of claim 13, further comprising individual antennas operably associated with the first and second transmit/receive circuitry respectively, the antennas being disposed within the microelectronic package within 24 inches of one another.

18. The microelectronic device of claim 13, further comprising individual antennas operably associated with the first and second transmit/receive circuitry respectively, the antennas being disposed within the microelectronic package within one inch of one another.

19. The microelectronic device of claim 13, further comprising individual antennas operably associated with the first and second transmit/receive circuitry respectively, the antennas being disposed within the microelectronic package within one half inch of one another.

20. The microelectronic device of claim 13, wherein the wireless communication comprises RF communication.

21. The microelectronic device of claim 13, wherein the microelectronic device comprises a hermetically-sealed device.

22. An integrated circuit die comprising:
   a processor; and
   a radio frequency communications circuit including an antenna, and further including:
   a ground interconnection; and
   a power supply interconnection, wherein the ground and power supply interconnections are the only electrical interconnections to the die.

23. The integrated circuit die of claim 22, wherein the radio frequency communications circuit comprises a receiver having an input coupled to the antenna and having an output coupled to the processor.

24. The integrated circuit die of claim 22, wherein the radio frequency communications circuit comprises a transmitter having an input coupled to the processor and having an output coupled to the antenna.

25. The integrated circuit die of claim 22, wherein the radio frequency communications circuit is configured to;

receive incoming data and couple the incoming data to the processor; and accept output data from the processor and transmit radio waves corresponding to the output data from the antenna.

26. The integrated circuit die of claim 22, wherein the radio frequency communications circuit is configured to receive incoming data and couple the incoming data to the processor and wherein the incoming data comprises instructions configured to cause the processor to execute a predetermined task.

27. A microelectronic device comprising:

a microelectronic package providing a housing within which integrated circuitry is received;

an integrated circuit die received within the microelectronic package and having integrated circuitry formed thereon, the integrated circuitry comprising first transmit/receive circuitry configured to transmit and receive radio frequency signals and including a processor coupled to the first transmit/receiver circuitry and configured to be operable via communications passed through the first transmit/receive circuitry; and second transmit/receive circuitry, discrete from the first transmit/receive circuitry and contained within the microelectronic package, the second transmit/receive circuitry being configured to transmit and receive radio frequency signals, wherein the first and second transmit/receive circuitry are configured to establish wireless communication between one another within the microelectronic package, wherein the die is void of external electrical connections for anything other than at least one of power and ground, and wherein the first and second transmit/receive circuitry comprise individual respective antennas configured to transmit and receive wireless RF communication.

28. The microelectronic device of claim 27, wherein the antennas are disposed within 24 inches of one another within the microelectronic package.

29. The microelectronic device of claim 27, wherein the antennas are disposed within one inch of one another within the microelectronic package.

30. The microelectronic device of claim 27, the antennas being disposed within one half inch of one another within the microelectronic package.

31. The microelectronic device of claim 27, wherein the microelectronic device is hand-carriable.

* * * * *

UNITED STATES PATENT AND TRADEMARK OFFICE
CERTIFICATE OF CORRECTION

PATENT NO. : 6,542,720 B1
DATED : April 1, 2003
INVENTOR(S) : Patrick W. Tandy

It is certified that error appears in the above-identified patent and that said Letters Patent is hereby corrected as shown below:

Column 1,
Line 26, replace "5,736,783, 5,763,945, 5,818,105, 5,117,068, and 5,692,298," with -- 5,736,783, 5,763,945, 5,818,105, 5,117,068, and 5,692,298, --

Column 6,
Line 51, replace "include a reduction in the number wire bonds necessary to" with -- include a reduction in the number of wire bonds necessary to --

Signed and Sealed this

Sixteenth Day of September, 2003

JAMES E. ROGAN
*Director of the United States Patent and Trademark Office*